United States Patent
Howard et al.

(10) Patent No.: US 8,431,826 B2
(45) Date of Patent: Apr. 30, 2013

(54) CAPACITIVE POWER AND GROUND PLANE STRUCTURE UTILIZING FRACTAL ELEMENTS FOR THE REDUCTION OF RADIATED EMISSIONS

(76) Inventors: James Robert Howard, Reno, NV (US); Gregory Llewellyn Lucas, Newark, CA (US)

( * ) Notice: Subject to any disclaimer, the term of this patent is extended or adjusted under 35 U.S.C. 154(b) by 317 days.

(21) Appl. No.: 12/800,358

(22) Filed: May 14, 2010

(65) Prior Publication Data
US 2011/0278045 A1   Nov. 17, 2011

(51) Int. Cl.
*H05K 1/00*   (2006.01)

(52) U.S. Cl.
USPC ............ 174/250; 174/255; 174/256; 174/257

(58) Field of Classification Search .................. 174/250, 174/52.2, 255, 256, 257, 261
See application file for complete search history.

(56) References Cited

U.S. PATENT DOCUMENTS

| | | | |
|---|---|---|---|
| 5,079,069 A * | 1/1992 | Howard et al. ............... | 428/209 |
| 5,155,655 A | 10/1992 | Howard | |
| 5,161,086 A | 11/1992 | Howard | |
| 5,745,333 A * | 4/1998 | Frankeny et al. ............. | 361/313 |
| 6,140,977 A | 10/2000 | Morales | |
| 6,476,766 B1 | 11/2002 | Cohen | |
| 7,019,695 B2 | 3/2006 | Cohen | |
| 7,215,290 B2 | 5/2007 | Cohen | |
| 7,245,196 B1 | 7/2007 | Baliarda | |
| 7,428,136 B2 * | 9/2008 | Barnett ...................... | 361/306.2 |

FOREIGN PATENT DOCUMENTS
WO   WO01/55221   7/2001

OTHER PUBLICATIONS

Borja, "Iterative Network Models to Predict the Performance of Sierpinski Fractal Antennas and Networks" Antennas and Propagation Society, IEEE 1999, vol. 1, Jul. 11-16, 1999, pp. 652-655.
Cohen, "Fractal Antennas Part 1: Introduction and the Fractal Quad", Communications Quarterly, Summer 1995, pp. 7-22.

* cited by examiner

*Primary Examiner* — Timothy Thompson
*Assistant Examiner* — Andargie M Aychillhum

(57) ABSTRACT

The construction of a capacitive Power and/or Ground plane sandwich with fractal element structures to achieve the reduction or elimination of radiated emissions as "noise" from the planes. This may be achieved in several formats, including the patterning of fractal elements on the outside edge of the ground plane, the patterning of fractal elements on the outside edge of the power plane and the patterning of fractal elements within both of the planes. Fractal element structures may also be formed on the edges of circuit lines, or other conductive elements within the printed circuit board. The ability of these fractal patterns to absorb or reject frequencies on the planes due to the operation of an electronic device on the printed circuit board enhancing and aiding the capacitive effect of the plane in the reduction or elimination of radiated emissions as electronic noise. By utilizing this design maximum quieting of electronic noise may be achieved in all axis (X,Y,Z) without the use of surface bypass capacitors or conventional techniques such as edge plating or via hole edge stitching.

7 Claims, 3 Drawing Sheets

Figure 1:
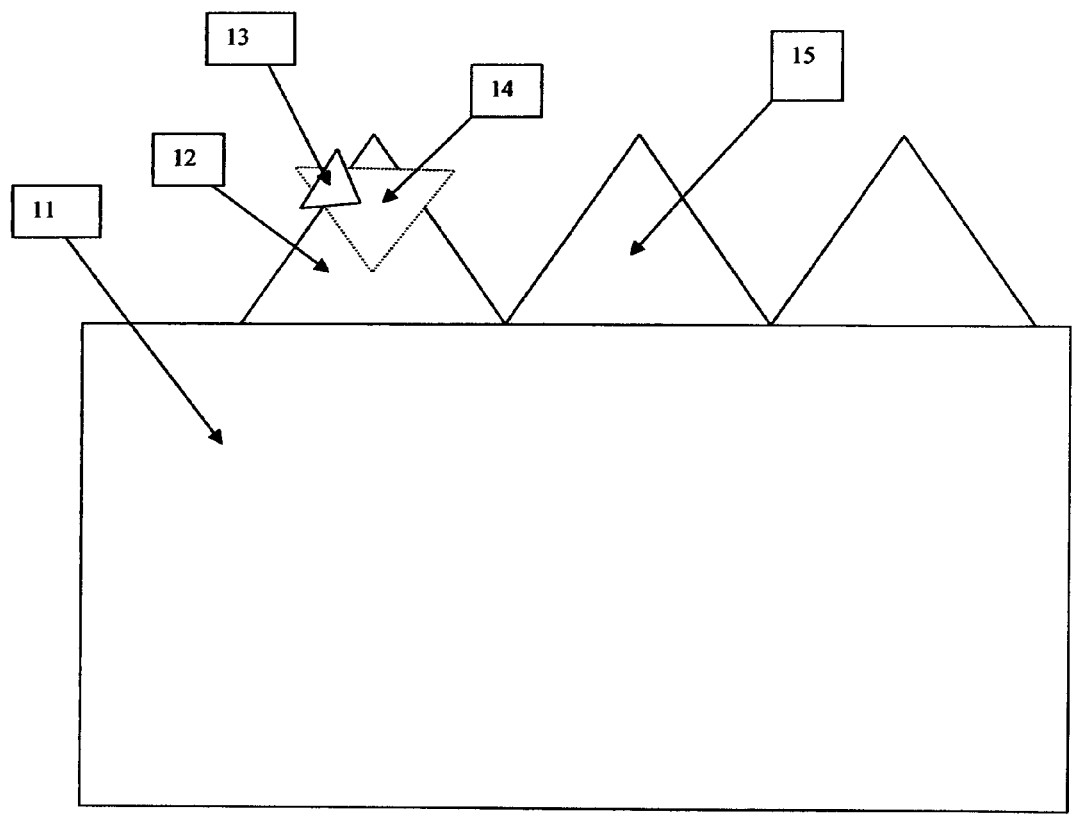

CAPACITIVE POWER AND GROUND PLANE STRUCTURE UTILIZING FRACTAL ELEMENTS FOR THE REDUCTION OF RADIATED EMISSIONS

BACKGROUND OF THE INVENTION

The general evolution capacitive power ground planes began with patents granted to Sisler of Convergent Systems and to Howard (the author of this application) in U.S. Pat. Nos. 5,079,069; 5,155,655; 5,161,086. These structures utilized thin power and ground sandwiches to provide a distributed capacitive electrical charge to active devices, normally mounted on the surface of the PCB. These distributed planes replaced the need for bypass capacitors in smaller values, typically 0.1 µfd or less and smoothing electronic noise on the power ground planes to reduce radiated emissions from the printed circuit board which are harmful to the operation of other devices and are regulated by FCC regulation.

The greatest limitation to the successful operation of these distributed capacitive planes is the remaining noise that is radiated from the edge of the planes. Up to 95% of radiated emission from the power ground planes is radiated from the edge of the planes. The reason for this is that pulses of electronic noise travel across the planes on various patterns which may be detected at various points. When these electronic noise pulses reach the edge on the plane the impedance raises from the very low impedance, which is a result of the high capacitance thin dielectric of the layer and low inductance of the closely coupled conductive planes of the power ground sandwich, and rises to the very high impedance of the unterminated edge. This causes reflection of some of the energy and radiation of electronic noise of the remainder. The result of this is much the same as an antenna VSWR with the total energy being divided between radiated and reflected energy.

The use of capacitive layers such as 0.002" FR4 dielectric which is a common dielectric used in the printed circuit industry at the time of this writing, actually make the problem worse than standard ground/power systems that are not closely coupled. The distributed capacitance plane better distributes the noise on the plane to all sectors of the printed circuit board, depending on design.

Improved materials, such as Cply from 3M have increased the dielectric constant of the dielectric material in the power ground sandwich. This has greatly improved the efficiency of the sandwich layer in reducing noise. Lower plane impedance and greater point source current capacity for less voltage sag mean less electronic noise is created to be resolved by the distributed capacitance plane. However even the improved materials do nothing to solve the termination problem of all edges and features of the printed circuit board power or ground conductive layers. As a result emissions continue, albeit at a lower general level.

Testing by industry sources has demonstrated that improved dielectric constant and reduced thickness of the capacitive layer has little beneficial effect in reducing edge emissions over standard 0.002" Fr4 materials at very high frequencies, above 1 GHz.

For this reason it is a benefit to the printed circuit industry to find a cost effective solution to this problem that will reduce printed circuit board electronic noise edge emissions at high frequencies. The invention shown in this application will reduce edge emissions from conductive sources including planes, capacitive sandwiches composed of power and ground planes, and circuit conductors at virtually no increase in material or processing costs.

A BRIEF DESCRIPTION OF THE DRAWINGS

FIG. 1 Shows an outside edge of ground plane or power plane with a type of fractal plane design. This pattern is derived from a Koch pattern is only one example of many fractal designs that might be chosen for this design feature.

Drawing note 11 depicts a conductive plane that might be a printed circuit board power plane or ground plane or a piece thereof.

Drawing note 12 depicts a geometric figure, in this case an Isosceles triangle which is used as the basic geometric shape for this Koch fractal design.

Drawing note 13 shows a geometric figure formed from the original Isosceles but reduced by a mathematical scale and inverted in position to form a star or snowflake type external pattern.

Drawing note 14 shows a geometric figure formed from the original Isosceles triangle as an intermediate step that is overlaid at a different angle to help form the star or snowflake.

Drawing note 15 shows only the original Isosceles triangle formed from the continuous material of the plane for reference.

Figure 2:
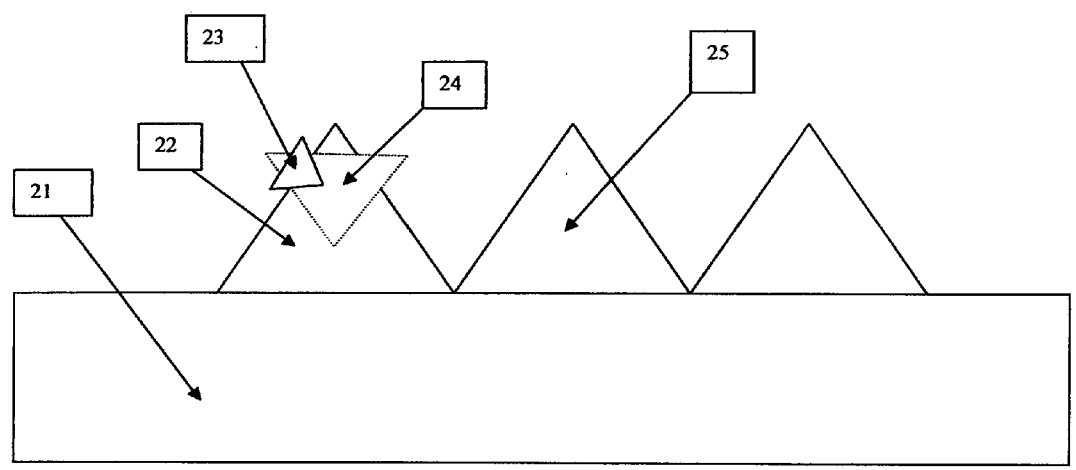

FIG. 2 Shows an outside edge of a standard conductive circuit or internal feature with a type of fractal plane design. This pattern is derived from a Koch pattern is only one example of many fractal designs that might be chosen for this design feature.

Drawing note 21 depicts a conductive circuit or other internal feature that might be a printed circuit board circuit, internal feature or a piece thereof.

Drawing note 22 depicts a geometric figure, in this case an Isosceles triangle which is used as the basic geometric shape for this Koch fractal design.

Drawing note 23 shows a geometric figure formed from the original Isosceles but reduced by a mathematical scale and inverted in position to form a star or snowflake type external pattern.

Drawing note 24 shows a geometric figure formed from the original Isosceles triangle as an intermediate step that is overlaid at a different angle to help form the star or snowflake.

Drawing note 25 shows only the original Isosceles triangle formed from the continuous material of the conductor or internal feature for reference.

Figure 3:
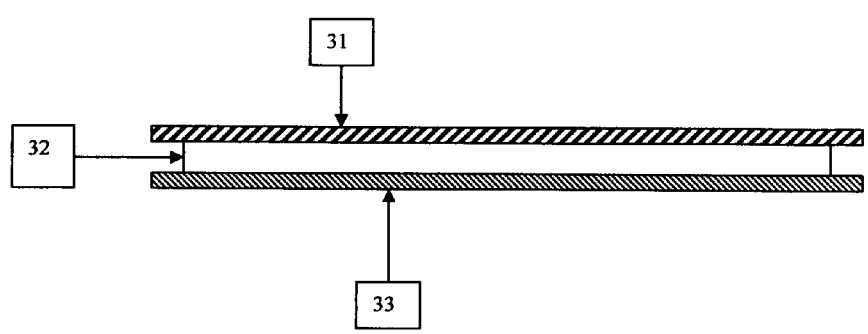

FIG. 3 depicts a capacitive power ground layer as it might be formed as a layer or within a printed circuit board with one of the layers having the fractal edge feature.

Drawing note 31 shows a conductive layer with the fractal edge with may be either a power or ground layer.

Drawing note 32 shows a dielectric layer which separates the power from the ground layer.

Drawing note 33 shows a standard copper layer opposite the fractal edged layer which may be sized slightly differently than the fractal layer to allow the capture of more edge radiated electronic noise.

Figure 4:
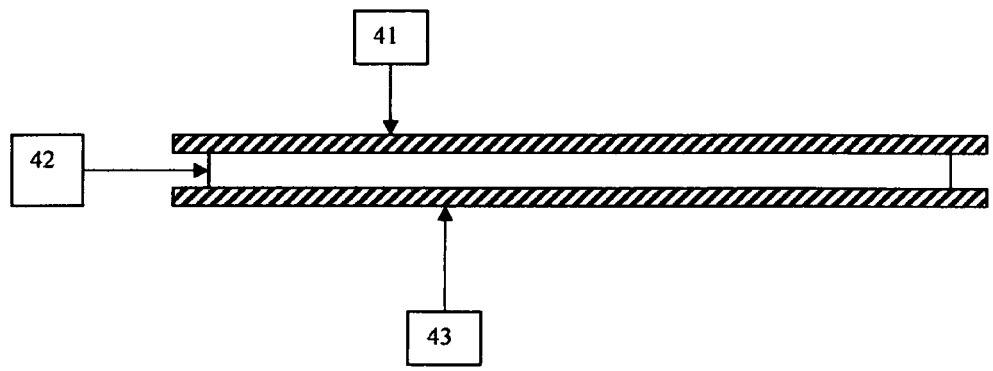

FIG. 4 depicts a capacitive power ground layer as it might be formed as a layer or within a printed circuit board with one of the layers having the fractal edge feature.

Drawing note 41 shows a conductive layer with the fractal edge with may be either a power or ground layer.

Drawing note 42 shows a dielectric layer which separates the power from the ground layer.

Drawing note 43 shows a fractal edged layer which may be sized slightly differently than the fractal layer to allow the capture of more edge radiated electronic noise.

Figure 5:
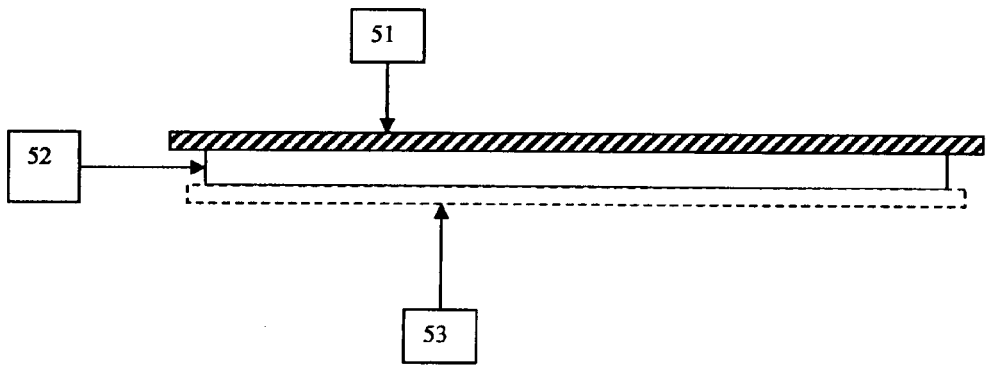

FIG. 5 depicts a fractal edged layer used as either a power or ground layer with the opposite layer removed to reduce expense, thickness or weight.

Drawing note 51 shows a conductive layer with the fractal edge with may be either a power or ground layer.

Drawing note 52 shows a dielectric layer which separates the power from the ground layer.

Drawing note 53 shows the removed layer, in dashed line, to contrast with the normal capacitive power and ground layer.

A DESCRIPTION OF THE PREFERRED EMBODIMENT OF THE INVENTION

The invention consists of three applications of the same technology.
1) Use of fractal patterns on the edges of the ground and/or power planes on the capacitive sandwich as shown in FIG. 1 of the drawings.
2) Use of fractal patterns on the edges of internal plane features such as anti pads internal breaks and plating thieving areas as shown in FIG. 2 of the drawings.
3) Use of fractal patterns on the edges of circuit pattern features to help reduce the radiation of those features as shown in FIG. 2 of the drawings.

The definition of fractal given by Wikipedia is:
A fractal is "a rough or fragmented geometric shape that can be split into parts, each of which is (at least approximately) a reduced-size copy of the whole, "[1] a property called self-similarity."

The use of fractal technology was introduced in 1988 by Nathan Cohen of Boston University when it was discovered that repeating patterns generated through applications of fractal mathematics made extremely effective antennas. The principal helps explain the effects found in printed circuit board capacitive power ground planes, in which a printed circuit board with holes and irregular features generated less noise than a simple uninterrupted copper plane. This is totally counter intuitive unless the effect of creating small areas of capacitance and inductance with the holes and features is considered. The effect is demonstrated through a series of resonance and anti resonance points that can be seen in test results.

A fractal antenna's response differs markedly from traditional antenna designs, in that it is capable of operating with good-to-excellent performance at many different frequencies simultaneously. Normally standard antennas have to be "cut" for the frequency for which they are to be used—and thus the standard antennas only work well at that frequency. This makes the fractal antenna an excellent design for wideband and multiband applications. It is further anticipated that these structures can absorb a wide range of frequencies.

Many fractal element antennas use the fractal structure as a virtual combination of capacitors and inductors. This makes the antenna so that it has many different resonances which can be chosen and adjusted by choosing the proper fractal design.

Electrical resonances may not be directly related to a particular scale size of the fractal antenna structure. The physical size of the antenna is unrelated to its resonant or broadband performance. The general rule of antenna length being near target frequency wavelength does not apply itself in the same way with fractal antennas.

This complexity arises because the current on the structure has a complex arrangement caused by the inductance and self capacitance. In general, although their effective electrical length is longer, the fractal element antennas are themselves physically smaller.

The current invention contemplates the use of fractal patterns to change the features of all the traditionally straight lines of the etched conductive planes. This could effectively dampen electronic noise emissions, making distributed capacitance planes more effective. In the case of a power and ground plane sandwich, as an example, the frequency absorbing edge features are initially thought to be most effective to be placed on the edges of the ground plane, which should be designed to slightly overlap the power plane. The amount of overlap is initially estimated to be 2 times the thickness of the dielectric layer. Within the overlap area as well as same contiguous and connected plane area the fractal patterns should be etched in the conductive plane pattern.

The current invention also contemplates the use of the fractal patterns to reduce the noise emission of a single plane or layer. Not used in combination with other planes or layers. This effect is due to the complex system of inductive and capacitive zones created by the fractal patterns as well as the effects of diffusion of radiated emissions due to the irregular shape of the edges of the conductive surfaces, the change in effective length of the radiating edges and the potential for frequency dithering caused by the many radiating surfaces of the fractal edges.

The reduction in noise of a single layer provides the opportunity to reduce the total number of layers needed to create the finished printed circuit board, which may significantly reduce the cost of the printed circuit board.

The invention also contemplates the beneficial use of fractal patterns on the external edges of circuits or circuit patterns to help reduce the noise emissions from these conductors. This also uses inductive and capacitive zones created by the fractal patterns as well as the effects of diffusion of radiated emissions due to the irregular shape of the edges of the conductive surfaces, the change in effective length of the radiating edges and the potential for frequency dithering caused by the many radiating surfaces of the fractal edges.

We claim:
1. A printed circuit board comprising a plurality of layers; said layers having one or more conductive elements for the conduction of electrical currents and said conductive elements having one or more conductive edges containing fractal geometric patterns for the reduction of electronic noise emissions.
2. The printed circuit board of claim 1 in which the conductive element is a power plane having conductive edges containing fractal geometric patterns for the reduction of electronic noise emissions.
3. The printed circuit board of claim 1 in which the conductive element is a ground plane having conductive edges containing fractal geometric patterns for the reduction of electronic noise emissions.
4. The printed circuit board of claim 1 in which the conductive element is a capacitve power and ground sandwich with both planes having conductive edges containing fractal geometric patterns for the reduction of electronic noise emissions.
5. The printed circuit board of claim 4 in which the power and ground sandwich has only one conductive element having conductive edges containing fractal geometric patterns for the reduction of electronic noise emissions and the opposite element with a standard edge pattern or shape.
6. The printed circuit board of claim 1 in which conductive signal traces are formed having conductive edges containing fractal geometric patterns for the reduction of electronic noise emissions.

7. The printed circuit board of claim 1 in which a conductive pattern is formed on any layer having conductive edges containing fractal geometric patterns for the reduction of electronic noise emissions.

\* \* \* \* \*